US012796564B2

(12) United States Patent
Stewing

(10) Patent No.: US 12,796,564 B2
(45) Date of Patent: Nov. 10, 2026

(54) SEMICONDUCTOR MODULE

(71) Applicant: Robert Bosch GmbH, Stuttgart (DE)

(72) Inventor: Felix Stewing, Steinheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 393 days.

(21) Appl. No.: 18/488,710

(22) Filed: Oct. 17, 2023

(65) Prior Publication Data

US 2024/0136343 A1 Apr. 25, 2024
US 2024/0234392 A9 Jul. 11, 2024

(30) Foreign Application Priority Data

Oct. 19, 2022 (DE) ..................... 10 2022 211 040.4

(51) Int. Cl.

| | |
|---|---|
| ***H02M 3/135*** | (2006.01) |
| ***H10D 84/01*** | (2026.01) |
| ***H10W 40/22*** | (2026.01) |
| ***H10W 70/60*** | (2026.01) |
| ***H10W 90/00*** | (2026.01) |

(52) U.S. Cl.

CPC ........... *H10W 90/00* (2026.01); *H02M 3/135* (2013.01); *H10D 84/01* (2025.01); *H10W 40/226* (2026.01); *H10W 70/60* (2026.01); *H10W 70/611* (2026.01)

(58) Field of Classification Search

CPC .. H02M 3/33571; H02M 3/135; H02M 7/162; H02M 7/4811; H02M 7/003; H05K 1/181; H05K 2201/10189; H01L 23/367; H01L 23/3677; H01L 25/072; H10D 1/68

See application file for complete search history.

(56) References Cited

U.S. PATENT DOCUMENTS

| | | | | |
|---|---|---|---|---|
| 2016/0247748 | A1* | 8/2016 | Kinzer | H01L 23/49562 |
| 2016/0285445 | A1* | 9/2016 | Takao | H05K 7/14329 |
| 2017/0154877 | A1* | 6/2017 | Tanimoto | H01L 25/072 |
| 2018/0308638 | A1* | 10/2018 | Ryou | H01G 4/33 |
| 2020/0176360 | A1* | 6/2020 | Kapusta | H01L 23/3121 |

FOREIGN PATENT DOCUMENTS

DE 102012224354 A1 9/2013

* cited by examiner

*Primary Examiner* — Galina G Yushina
(74) *Attorney, Agent, or Firm* — NORTON ROSE FULBRIGHT US LLP

(57) ABSTRACT

A semiconductor module. The semiconductor module includes: at least one semiconductor switch and a capacitor component, wherein the capacitor component has a lateral finger structure and includes a semiconductor substrate, at least two first electrodes, at least two second electrodes. The first electrodes and the second electrodes respectively have identical basic forms and are formed alternatingly next to one another at a predefined distance within and/or on the semiconductor substrate and are configured to be contacted individually from outside the capacitor component via respective contacting regions. At least a portion of the first electrodes and of the second electrodes is electrically connected via respective contacting regions of the capacitor component to respective contacting regions of the semiconductor switch, and the capacitor component and the semiconductor switch are integrated into the semiconductor module.

10 Claims, 4 Drawing Sheets

SEMICONDUCTOR MODULE

FIELD

The present invention relates to a semiconductor module and in particular to a semiconductor module with an integrated half-bridge circuit with an intermediate circuit capacitor.

BACKGROUND INFORMATION

Three-phase brushless DC motors, which are driven on the basis of silicon semiconductors, are, for example, described in the related art. In this case, a switching frequency of the semiconductors is often selected in a range of at least 20 kHz since frequencies in this range can no longer be perceived by the human ear. On the other hand, it is desirable to set switching frequencies as low as possible in order to keep switching losses of the inverter as low as possible.

In order to reduce switching losses even at higher switching frequencies, GaN semiconductors are increasingly used in motor inverters, which in particular in combination with ceramic capacitors as intermediate circuit capacitors enable correspondingly higher switching frequencies. Such GaN semiconductors usually have a lateral finger structure. An optimal design of a commutation cell is nonetheless only possible if a layer structure of a carrier circuit board follows particular design rules, e.g., a distance from layer 1 to layer 2 should be as low as possible (e.g., 75 μm).

SUMMARY

According to a first aspect of the present invention, a semiconductor module, in particular a power module with GaN-based semiconductor switches, is provided, on the basis of which fast switching inverters with low power loss can be formed, for example.

According to an example embodiment of the present invention, the semiconductor module comprises a capacitor component which has a lateral finger structure and comprises a semiconductor substrate (e.g., a silicon substrate), at least two first electrodes and at least two second electrodes, wherein a higher number of first and second electrodes is advantageously used. Moreover, the semiconductor module comprises at least one semiconductor switch, in particular at least one GaN-based semiconductor switch with a lateral finger structure.

The first electrodes and the second electrodes of the capacitor component respectively have identical basic forms formed alternatingly next to one another at a predefined distance within and/or on the semiconductor substrate. Identical basic forms are also to be understood to mean those forms that can be transformed into one another by rotation and/or mirroring. Even if the respective electrodes are arranged alternatingly next to one another in a strip-like manner in an advantageous configuration, basic forms with curved and/or meandering or deviating contours are also possible.

Moreover, it is possible that each of the electrodes is formed from a plurality of sub-electrodes, which can be electrically contacted together at a respective contact region of the respective electrode. In such a case, it is possible that the identical form of the first and second electrodes relates to the forms of the sub-electrodes that are combined to form respective first and second electrodes. Alternatively, or additionally, it is possible that the identical basic form of the first and second electrodes relates to an arrangement of related sub-electrodes of each electrode considered as a whole.

Furthermore, the first electrodes and the second electrodes are configured to be contacted individually via respective contacting regions of the first electrodes and of the second electrodes, which are, for example, designed as contact surfaces or contact pads. For example, the contact surfaces are designed as copper surfaces, without thereby being restricted to copper as the material used for this purpose.

According to an example embodiment of the present invention, at least a portion of the first electrodes and of the second electrodes is electrically connected via respective contacting regions of the capacitor component to respective contacting regions of the semiconductor switch, and the capacitor component and the semiconductor switch are integrated into the semiconductor module, which is designed as an SMD component, for example. In such an arrangement, the capacitor component functions, for example, as a snubber capacitor, without being thereby restricted to such an application.

The nested structure of respective first electrodes and second electrodes resulting from the alternating arrangement enables optimized magnetic field quenching within the capacitor component and thus minimized parasitic inductance of the capacitor component. This is in particular true if the capacitor component is used as a total capacitance resulting from individually connected sub-capacitances between the respective first and second electrodes. Preferably, for this purpose, the respective first electrodes of the capacitor component are at a first potential (e.g., a plus potential) and the respective second electrodes are at a second potential (e.g., a minus potential, or vice versa).

According to an example embodiment of the present invention, preferably, in a plan view, the first electrodes and the second electrodes respectively have an (identical) rectangular basic form, wherein the electrodes are advantageously at least two times, and more preferably at least three times, longer than wide, and wherein the respective electrodes are advantageously arranged alternatingly next to one another in such a way that their respective longer sides face one another. This explicitly does not rule out that the electrodes can also have a square basic form. Particularly preferably, the first and second electrodes are respectively aligned parallel to one another.

Moreover, according to an example embodiment of the present invention, it is possible for the respective contacting regions of the first electrodes and of the second electrodes to be arranged next to one another on the same side of the capacitor component. Alternatively, the first electrodes are arranged next to one another on one side of the capacitor component, while the second electrodes are arranged next to one another on a side of the capacitor component opposite the first side.

It should be pointed out that the number of the first electrodes and of the second electrodes of the capacitor component can preferably be higher than two and is particularly advantageously adapted to a number of fingers of the lateral structure of the semiconductor switch that is electrically coupled to the capacitor component according to the present invention. In such a case, electrical connection ideally takes place in such a way that each electrode of the capacitor component is separately connected to a respectively corresponding finger of the at least one semiconductor switch.

Preferred developments of the present invention are disclosed herein.

In an advantageous configuration of the present invention, the capacitor component is designed as a silicon capacitor, which is particularly advantageously formed on the basis of a plurality of deep trench silicon capacitors. In order to realize desired capacitances or sub-capacitances and/or desired current and voltage ratings for the capacitor component, it is possible on this basis to form a correspondingly high number of deep trench silicon capacitors, which can be combined by means of one or more metallization planes to form respective individually contactable, first and second electrodes of the capacitor component. Alternatively, or additionally, it is possible for the capacitor component to be designed as a ceramic capacitor. Moreover, it is possible to form the individual electrodes as plate-shaped electrodes. Furthermore, the at least one semiconductor switch is particularly advantageously designed as a GaN semiconductor switch, as described above.

Advantageously, according to an example embodiment of the present invention, a pitch (i.e., a center-to-center distance) of the structures of the capacitor component and of the semiconductor switch and/or a pitch of the contacting regions of the capacitor component and of the semiconductor switch is designed to be substantially identical. For example, such a pitch is in the range of 250 μm to 500 μm, without thereby being restricted to such a range.

In a particularly advantageous configuration of the present invention, at least the electrical connections of the first electrodes of the capacitor component to the semiconductor switch are arranged substantially parallel to one another, while at least the electrical connections of the second electrodes of the capacitor component to the semiconductor switch are arranged substantially parallel to one another. Thus, minimization of parasitic inductances can additionally be achieved in the connection of the capacitor component to the at least one semiconductor switch of the semiconductor module. It should be pointed out that such a parallel arrangement does not rule out that sections of the connection lines may also run non-parallel depending on an arrangement of the contacting regions on the capacitor component (e.g., on one side or on opposite sides) and/or further boundary conditions. In particular, it is possible for connection lines that contact the first electrodes and connection lines that contact the second electrodes to be arranged non-parallel in particular sections.

The capacitor component and the at least one semiconductor switch are directly and/or indirectly electrically connected to one another, for example by means of bonding wires and/or conductor paths of a printed circuit board (PCB) and/or a soldered connection and/or a sintered connection and/or a stamped sheet metal and/or vias (e.g., by means of so-called “through silicon vias,” etc.).

In a particularly preferred configuration of the present invention, the capacitor component is stacked on the semiconductor switch and/or on a half bridge formed from two semiconductor switches, in particular on a half bridge designed to be monolithically integrated, whereby a particularly high integration level with particularly low parasitic inductance (due to particularly short connection paths) can be achieved. For this purpose, the capacitor component can, for example, be directly connected to the at least one semiconductor switch by means of a “die-to-die attach” method. In such a case, the two components can be directly electrically contacted, for example by means of a soldered connection and/or a sintered connection.

Preferably, according to an example embodiment of the present invention, the capacitor component is provided as an intermediate circuit capacitor for a half-bridge circuit (e.g., for an inverter) consisting of the semiconductor switch and a further semiconductor switch. In this context in particular, it is advantageous if resistances of metallization planes of the capacitor component are adapted in accordance with desired damping properties for the half-bridge circuit and are not necessarily designed with the minimum possible resistance. For this purpose, resistance values in the range of 100 mΩ to 10Ω, and preferably in the range of 300 mΩ to 3Ω, can be used advantageously, without thereby being restricted to the aforementioned resistance ranges. Further advantageously, a gate driver for the half-bridge circuit is additionally integrated in the semiconductor module, which gate driver can in particular be monolithically integrated in at least one of the semiconductor switches of the half-bridge circuit. In this way, a particularly compact half-bridge circuit and/or a particularly compact inverter can be realized on the basis of such a half-bridge circuit with intermediate circuit capacitor, wherein parasitic inductances can be further reduced by the integration of the gate driver into the semiconductor module. It should also be pointed out that the semiconductor module can comprise a plurality of half-bridge circuits with respectively corresponding intermediate circuit capacitors in order to form a multi-phase inverter, for example.

In a further advantageous configuration of the present invention, the components (i.e., the capacitor component and at least one semiconductor switch) integrated into the semiconductor module are embedded in a printed circuit board (e.g., as a mini-PCB) by means of an embedding technology. Alternatively, or additionally, the components are encapsulated by means of a housing, wherein the housing can in particular be formed by means of conventional methods. Suitable as such are, for example, injection molding methods which can use a cast resin (e.g., an epoxy resin) to form a corresponding module housing.

Particularly advantageously, according to an example embodiment of the present invention, the semiconductor module comprises a cooling element (e.g., a cooling pad), which is thermally (e.g., via VIAs, etc.) coupled to the at least one semiconductor switch and/or the capacitor component in order to dissipate heat generated by the active components of the semiconductor module, to outside the semiconductor module.

In a further advantageous configuration of the present invention, an electrically isolated cooling element is respectively provided for each semiconductor switch and/or the capacitor component, wherein a thermal coupling can be present and advantageously used despite electrical isolation of the cooling elements.

BRIEF DESCRIPTION OF THE DRAWINGS

Exemplary embodiments of the present invention are described in detail below with reference to the figures.

DETAILED DESCRIPTION OF EXAMPLE EMBODIMENTS

Figure 1:
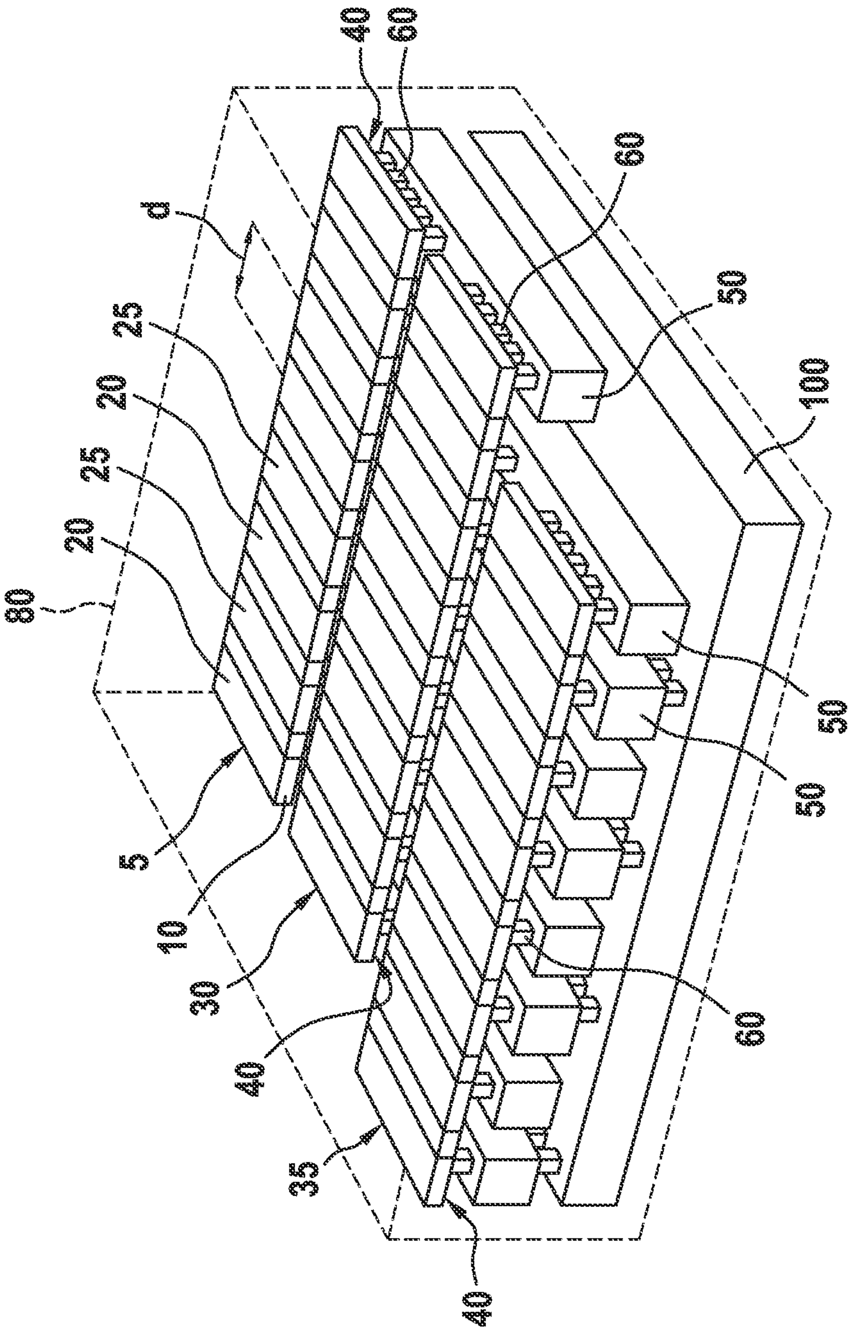
FIG. 1 shows a schematic view of a first example embodiment of a semiconductor module according to the present invention.

FIG. 1 shows a schematic view of a first embodiment of a semiconductor module according to the present invention, comprising a capacitor component 5 with a lateral finger structure, a first semiconductor switch 30 with a lateral finger structure, and a second semiconductor switch 35 with a lateral finger structure.

The first semiconductor switch 30 and the second semiconductor switch 35 are respectively designed as GaN transistors and interconnected to form a half-bridge circuit, which can be used, for example, in an inverter.

The capacitor component 5, which functions here as an intermediate circuit capacitor for such an inverter, is designed to be monolithically integrated on the basis of a silicon semiconductor substrate 10.

The capacitor component 5 comprises a plurality of first electrodes 20 and a plurality of second electrodes 25, which are respectively designed as deep trench electrodes here and which are contactable from outside the capacitor component 5 via respective contacting regions 40 ("pads"). For this purpose, each contacting region 40 is connected to electrical connections 50 by means of a plurality of contactings 60, wherein the electrical connections 50 are provided for the electrical connection of the semiconductor switches 30, 35 and the capacitor component 5 to one another and/or for the external contacting of the circuit consisting of the aforementioned components 5, 30, 35. Since the electrical connections 50 are formed parallel here, parasitic inductances within the semiconductor module can be advantageously reduced.

The first electrodes 20 and the second electrodes 25 of the capacitor component 5 respectively have identical basic forms and are formed alternatingly next to one another at a predefined distance. A pitch d (i.e., a center-to-center distance) of the contacting regions 40 of the respective electrodes 20, 25 is thus a uniform distance, which here corresponds to 250 μm. The contacting regions 40 of the respective electrodes 20, 25 are respectively arranged here on the same side of the capacitor component 5.

The capacitor component 5 and the semiconductor switches 30, 35 are encapsulated by means of a housing 80 (e.g., a cast resin housing), while external terminals of the semiconductor module are exposed for external contacting on the outside of the housing 80.

Figure 2:
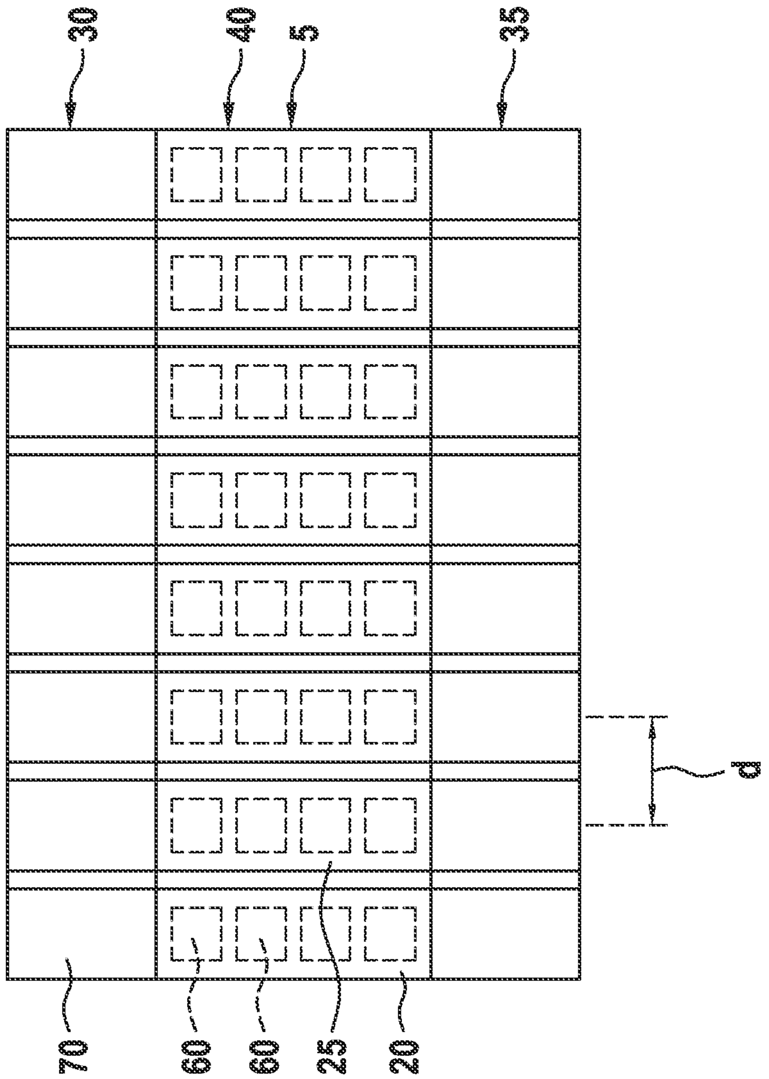
FIG. 2 shows a schematic plan/top view of a second example embodiment of the semiconductor module according to the present invention.

FIG. 2 shows a schematic view of a second embodiment of the semiconductor module according to the present invention, wherein, analogously to the first embodiment in FIG. 1, the second embodiment likewise represents a half-bridge circuit consisting of a first GaN-based semiconductor switch 30 and a second GaN-based semiconductor switch 35, which are connected to a capacitor component 5 according to the present invention. In order to avoid repetitions, reference is therefore made to the statements regarding FIG. 1, and mainly differences from the first embodiment are described below.

In the second embodiment, the capacitor component 5 is arranged on and electrically contacted with a monolithically integrated arrangement consisting of the first semiconductor switch 30 and the second semiconductor switch 35, wherein a pitch of the capacitor component, of the first semiconductor switch 30 and of the second semiconductor switch 35 is designed to be identical. The contacting of the capacitor component 5 with the semiconductor switches 30, 35 is implemented here, for example, by means of vias in the form of TSVs ("through silicon vias"). Alternatively, or additionally, it is possible, for example, to form such contacting as a sintered connection or the like.

In addition, a region in which a gate driver 70 for the half-bridge circuit is formed is provided within the first semiconductor switch 30.

The second embodiment described above therefore inter alia offers the advantage of a particularly high integration capability of the individual components 5, 30, 35 since they are arranged in a particularly space-saving manner. In addition, the very dense arrangement of the components 5, 30, 35 and of the gate driver offers the advantage of particularly short conduction paths of the electrical connections 50, whereby parasitic inductances can be further reduced.

Figure 3:
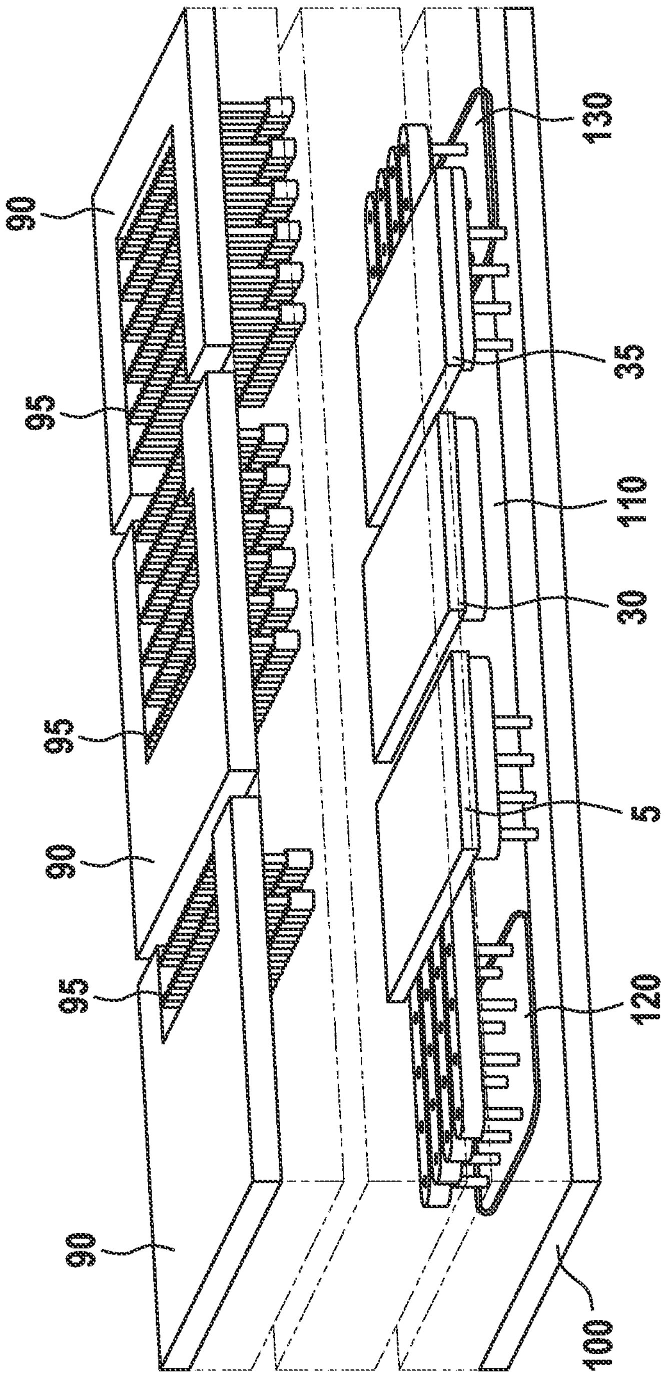
FIG. 3 shows a schematic view of a third example embodiment of the semiconductor module according to the present invention.
Figure 4:
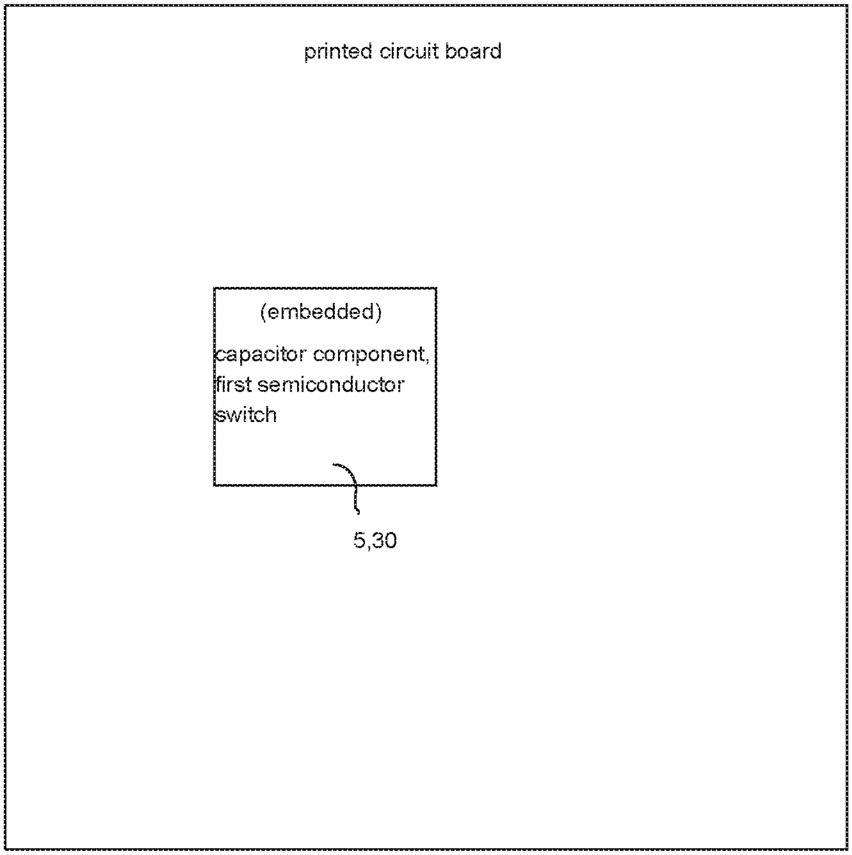
FIG. 4 schematically shows the semiconductor module comprising capacitor component 5 and first semiconductor switch 30 embedded in a printed circuit board.

FIG. 3 shows a schematic view of a third embodiment of the semiconductor module according to the present invention, wherein, analogously to the first and to the second embodiment, the third embodiment likewise represents a half-bridge circuit consisting of a first GaN-based semiconductor switch 30 and a second GaN-based semiconductor switch 35, which are connected to a capacitor component 5 according to the present invention. In order to avoid repetitions, reference is therefore made to the statements regarding FIG. 1 and regarding FIG. 2, and mainly differences from the first and from the second embodiment are described below.

The semiconductor module in the third embodiment additionally comprises three cooling elements 90 electrically isolated from one another, wherein a cooling element 90 for cooling the capacitor component 5, a cooling element 90 for cooling the first semiconductor switch 30, and a cooling element 90 for cooling the second semiconductor switch 35 are provided. The cooling elements 90 are designed here as copper plates, which are thermally coupled to the respective components 5, 30, 35 via respective thermal contacting regions 95 with a plurality of vias.

A printed circuit board 100 on which the components 5, 30, 35 are arranged has a ground terminal 110, a battery terminal 120, and a phase terminal 130 for external electrical contacting of the semiconductor module.

It should be pointed out that the components 5, 30, 35 can be particularly advantageously integrated into the printed circuit board by means of an embedding technology.

The invention claimed is:

1. A semiconductor module, comprising:

a capacitor component which has a lateral finger structure, a semiconductor substrate, at least two first electrodes, at least two second electrodes; and at least one semiconductor switch with a lateral finger structure;

wherein the first electrodes and the second electrodes: respectively have identical basic forms, are formed within and/or on the semiconductor substrate alternatingly next to one another at a predefined distance, and are configured to be contacted individually from outside the capacitor component via respective contacting regions, at least a portion of the first electrodes and of the second electrodes is electrically connected via respective contacting regions of the capacitor component to respective contacting regions of the semiconductor switch, and the capacitor component and the semiconductor switch are integrated into the semiconductor module, wherein the at least one semiconductor switch is a GaN-based lateral finger transistor, the plurality of first and second electrodes of the capacitor component are electrically coupled to respective fingers of the semiconductor switch in a one-to-one correspondence.

2. The semiconductor module according to claim 1, wherein:

the capacitor component is formed as a silicon capacitor and based on a plurality of deep trench silicon capacitors.

3. The semiconductor module according to claim 1, wherein a pitch of structures of the capacitor component and of the semiconductor switch and/or a pitch of the contacting regions of the capacitor component and of the semiconductor switch, are substantially identical and are a range of 250 μm to 500 μm.

4. The semiconductor module according to claim 1, wherein:

at least electrical connections of the first electrodes of the capacitor component to the semiconductor switch are arranged substantially parallel to one another, and at least electrical connections of the second electrodes of the capacitor component to the semiconductor switch are arranged substantially parallel to one another.

5. The semiconductor module according to claim 1, wherein the capacitor component and the semiconductor switch are directly and/or indirectly electrically connected to one another using bonding wires, and/or conductor paths, and/or a soldered connection, and/or a sintered connection, and/or a stamped sheet metal, and/or vias.

6. The semiconductor module according to claim 1, wherein the capacitor component is stacked on the semiconductor switch and/or on a half bridge formed from two semiconductor switches and monolithically integrated.

7. The semiconductor module according to claim 1, wherein:

the capacitor component is provided as an intermediate circuit capacitor for a half-bridge circuit including the semiconductor switch and a further semiconductor switch, and/or resistances of metallization planes of the capacitor component are adapted in accordance with desired damping properties for the half-bridge circuit, and/or a gate driver for the half-bridge circuit is integrated into the semiconductor module and is monolithically integrated into at least one of the semiconductor switch and the further semiconductor switch of the half-bridge circuit.

8. The semiconductor module according to claim 1, wherein the capacitor component and the semiconductor switch integrated into the semiconductor module are:

embedded in a printed circuit board via an embedding technology, and/or encapsulated using a housing.

9. The semiconductor module according to claim 1, further comprising a cooling element which is thermally coupled to the at least one semiconductor switch and/or the capacitor component.

10. The semiconductor module according to claim 8, wherein an electrically isolated cooling element is provided for the semiconductor switch and/or the capacitor component.

* * * * *